(12) United States Patent
Mizugaki

(10) Patent No.: US 11,818,958 B2
(45) Date of Patent: Nov. 14, 2023

(54) VIBRATION DEVICE

(71) Applicant: SEIKO EPSON CORPORATION, Tokyo (JP)

(72) Inventor: Koichi Mizugaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 652 days.

(21) Appl. No.: 17/034,110

(22) Filed: Sep. 28, 2020

(65) Prior Publication Data

US 2021/0098682 A1 Apr. 1, 2021

(30) Foreign Application Priority Data

Sep. 30, 2019 (JP) ................................. 2019-178838

(51) Int. Cl.
*H10N 30/87* (2023.01)
*H10N 30/80* (2023.01)
*H10N 30/88* (2023.01)
*H03H 3/02* (2006.01)
*H03H 9/10* (2006.01)

(52) U.S. Cl.
CPC ......... *H10N 30/875* (2023.02); *H10N 30/802* (2023.02); *H10N 30/88* (2023.02); *H03H 3/02* (2013.01); *H03H 9/1021* (2013.01)

(58) Field of Classification Search
CPC .... H10N 30/875; H10N 30/802; H10N 30/88; H03H 3/02; H03H 9/1021
See application file for complete search history.

(56) References Cited

U.S. PATENT DOCUMENTS

| 2006/0006539 | A1 | 1/2006 | Matsui et al. |
| 2006/0220182 | A1 | 10/2006 | Uchiyama |
| 2013/0135056 | A1* | 5/2013 | Allegato ............... H03H 9/1057 331/116 R |
| 2021/0098680 | A1* | 4/2021 | Mizugaki ............... H03B 5/362 |

FOREIGN PATENT DOCUMENTS

| JP | 2006-019431 | 1/2006 |
| JP | 2006/0220182 | 9/2006 |
| JP | 2020-036262 | 3/2020 |

* cited by examiner

*Primary Examiner* — David Vu
*Assistant Examiner* — Brandon C Fox
(74) *Attorney, Agent, or Firm* — Rankin, Hill & Clark LLP

(57) ABSTRACT

A vibration device includes a semiconductor substrate having a first surface and a second surface, an integrated circuit disposed on the first surface, a first terminal which is disposed on the second surface and to which a substrate potential is applied, a second terminal which is disposed on the second surface and to which a potential different from the substrate potential is applied, a first through electrode which is configured to electrically couple the first terminal and the integrated circuit to each other, a second through electrode which is configured to electrically couple the second terminal and the integrated circuit to each other, a frame which has an insulating property, a vibration element disposed on the first surface, and a lid bonded to the first surface, wherein the first through electrode is located outside the frame, and the second through electrode is located inside the frame.

7 Claims, 10 Drawing Sheets

VIBRATION DEVICE

The present application is based on, and claims priority from JP Application Serial Number 2019-178838, filed Sep. 30, 2019, the disclosure of which is hereby incorporated by reference herein in its entirety.

BACKGROUND

1. Technical Field

The present disclosure relates to a vibration device.

2. Related Art

The semiconductor device described in JP-A-2006-019431 (Document 1) has a silicon substrate. In the silicon substrate, there are formed a cylindrical through electrode penetrating the silicon substrate, a first insulating film covering the sidewall of the cylindrical through electrode, and striped through electrodes which are located inside the cylindrical through electrode, and penetrate the silicon substrate. Therefore, even when, for example, a bump to be coupled to a through hole has contact not only with the through hole but also with the silicon substrate on the periphery of the through hole to leak a current from a terminal to the silicon substrate via that contact portion, an insulation failure is difficult to occur. Therefore, it is possible to prevent the deterioration of the reliability of the semiconductor device.

However, when disposing such a cylindrical through electrode and such an insulating film as those disclosed in Document 1 on the periphery of every through electrode, growth in size of the semiconductor device is incurred.

SUMMARY

A vibration device according to an application example includes a semiconductor substrate having a first surface and a second surface in an obverse-reverse relationship, an integrated circuit disposed on the first surface, a first terminal which is disposed on the second surface and to which a substrate potential is applied, a second terminal which is disposed on the second surface and to which a potential different from the substrate potential is applied, a first through electrode which penetrates the semiconductor substrate, and is configured to electrically couple the first terminal and the integrated circuit to each other, a second through electrode which penetrates the semiconductor substrate, and is configured to electrically couple the second terminal and the integrated circuit to each other, a frame which penetrates the semiconductor substrate, and has an insulating property, a vibration element disposed on the first surface, and a lid bonded to the first surface, wherein the first through electrode is located outside the frame, and the second through electrode is located inside the frame.

The vibration device according to the application example may further include an insulating film which has a through hole, and is disposed between the second surface and the second terminal, wherein the second terminal may electrically be coupled to the second through electrode via the through hole.

In the vibration device according to the application example, the through hole may be larger in width than the second through electrode, the through hole may be surrounded by the frame in a plan view, and the second terminal may electrically be coupled to an area inside the frame of the semiconductor substrate via the through hole.

In the vibration device according to the application example, the frame may include a hole penetrating the semiconductor substrate, an insulating film disposed on an inner surface of the hole, and an electrically-conductive material filling the hole.

In the vibration device according to the application example, the integrated circuit may be supplied with power via the second terminal, and the second through electrode may electrically be coupled to the electrically-conductive material.

In the vibration device according to the application example, a signal from the integrated circuit may be output via the second terminal, and the second through electrode may fail to electrically be coupled to the electrically-conductive material.

In the vibration device according to the application example, a length of the second through electrode may be longer than a width of the second through electrode.

DESCRIPTION OF EXEMPLARY EMBODIMENTS

A vibration device according to the present application example will hereinafter be described in detail based on some embodiments shown in the accompanying drawings.

First Embodiment

Figure 1:
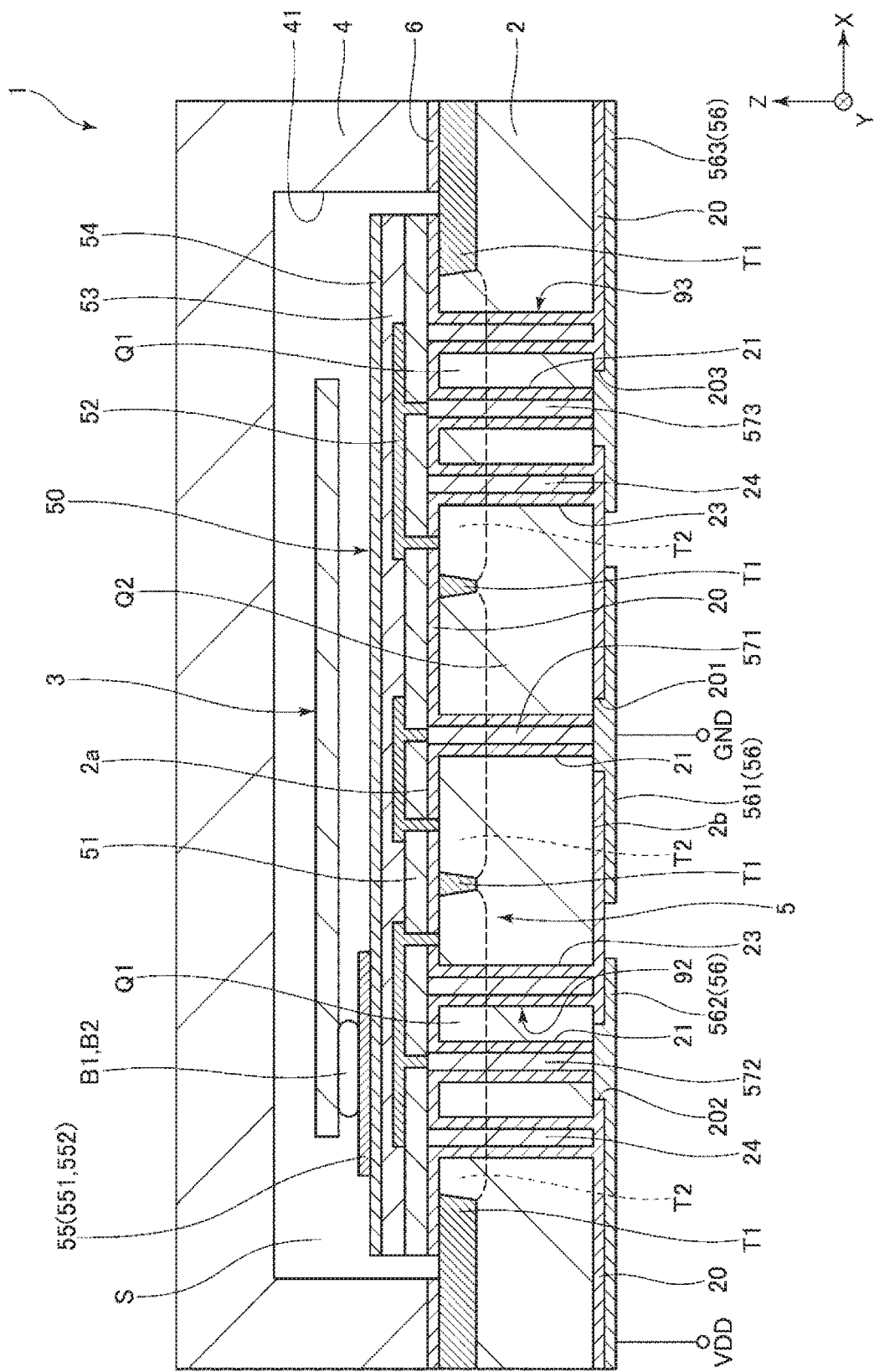
FIG. 1 is a cross-sectional view showing a vibration device according to a first embodiment.
Figure 2:
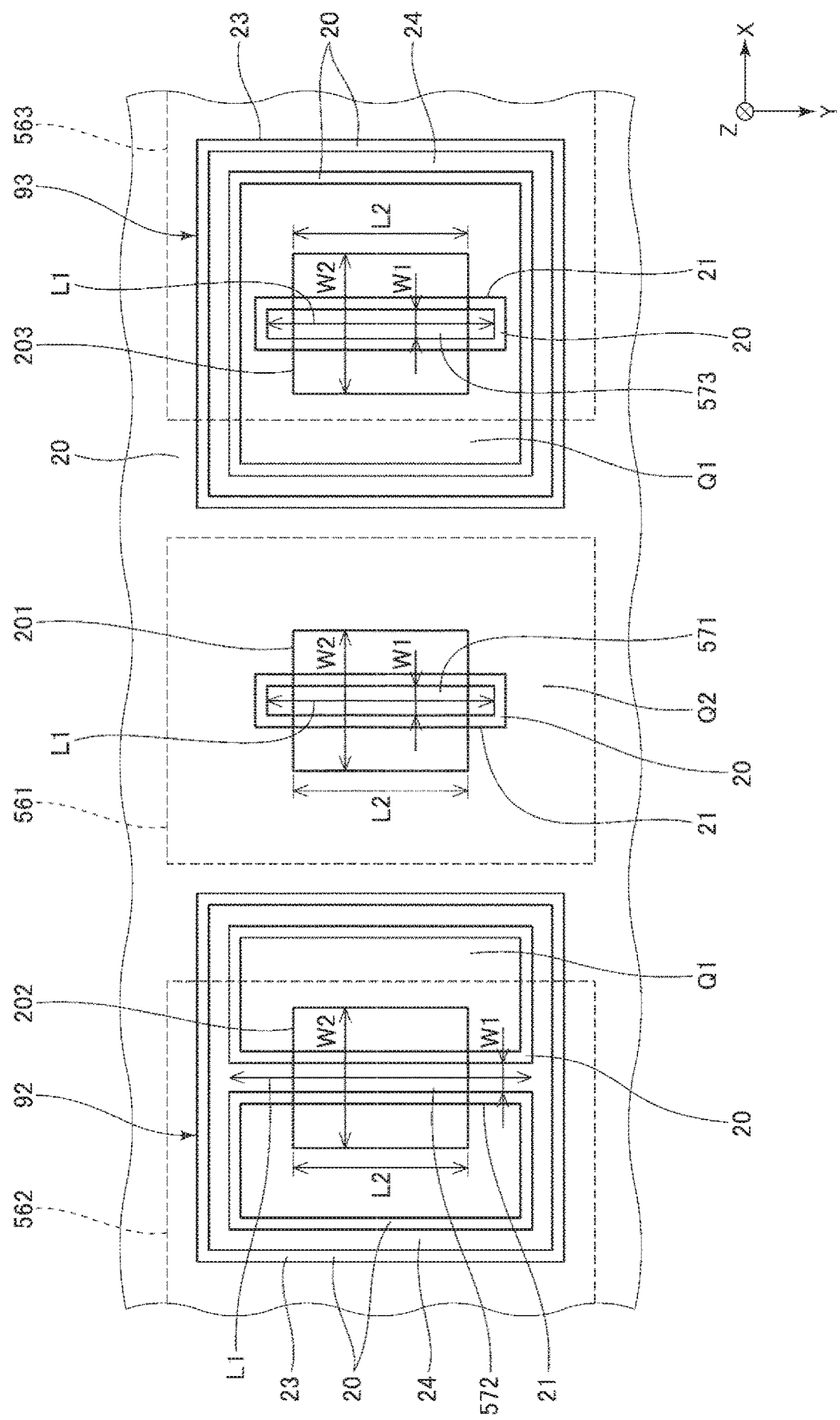
FIG. 2 is a bottom view of a base substrate.
Figure 3:
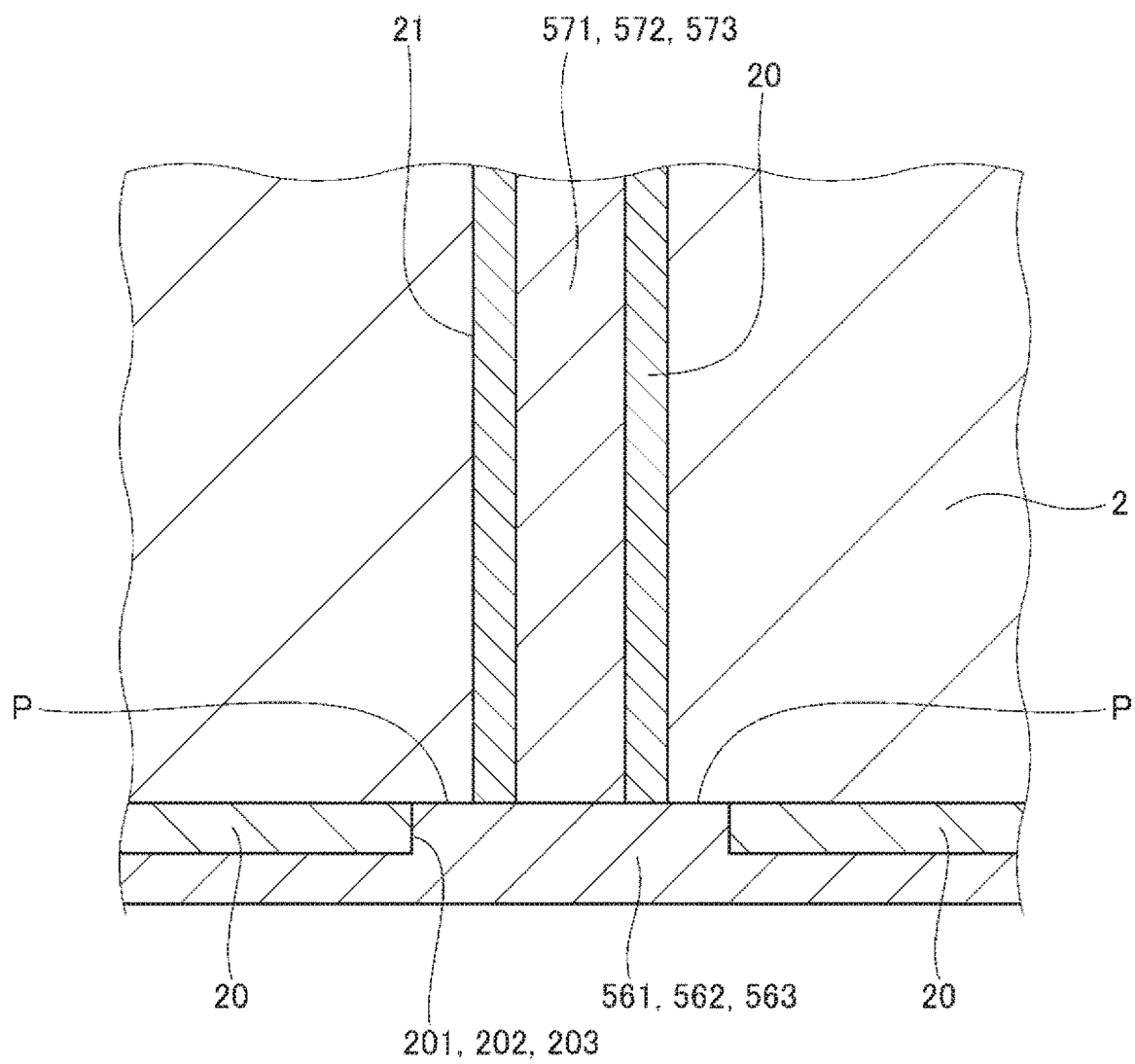
FIG. 3 is a cross-sectional view showing a coupling state between a through electrode and a terminal.
Figure 3:
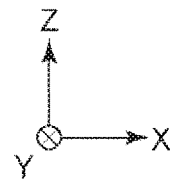
Figure 4:
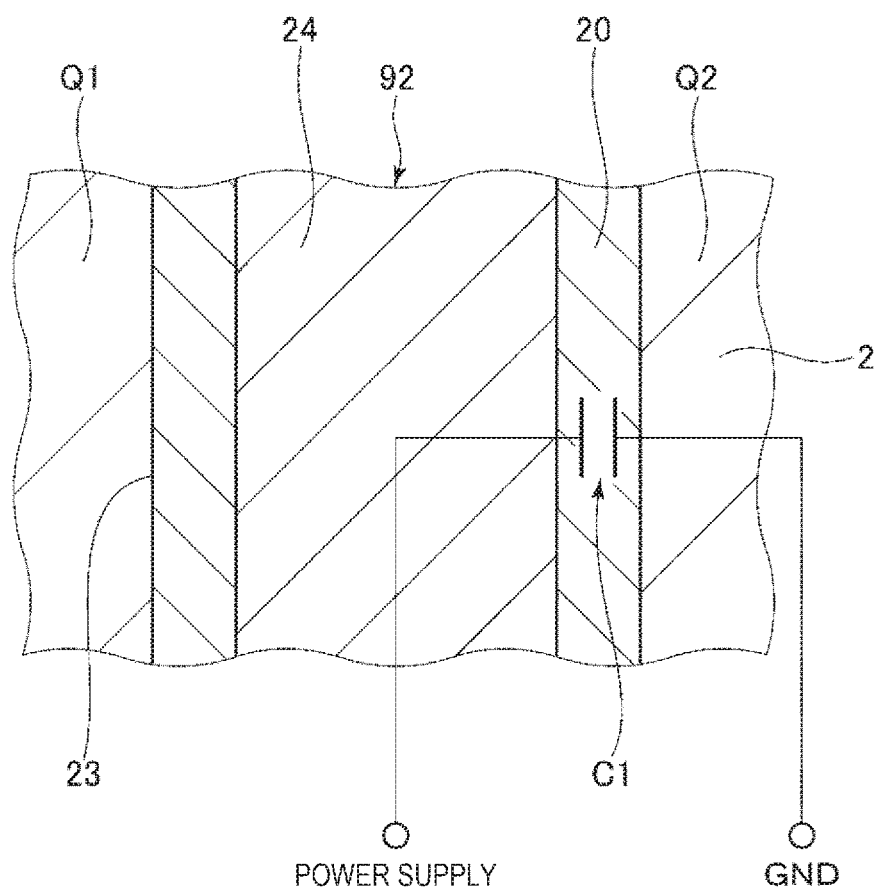
FIG. 4 is a cross-sectional view showing a capacitor formed in the base substrate.
Figure 5:
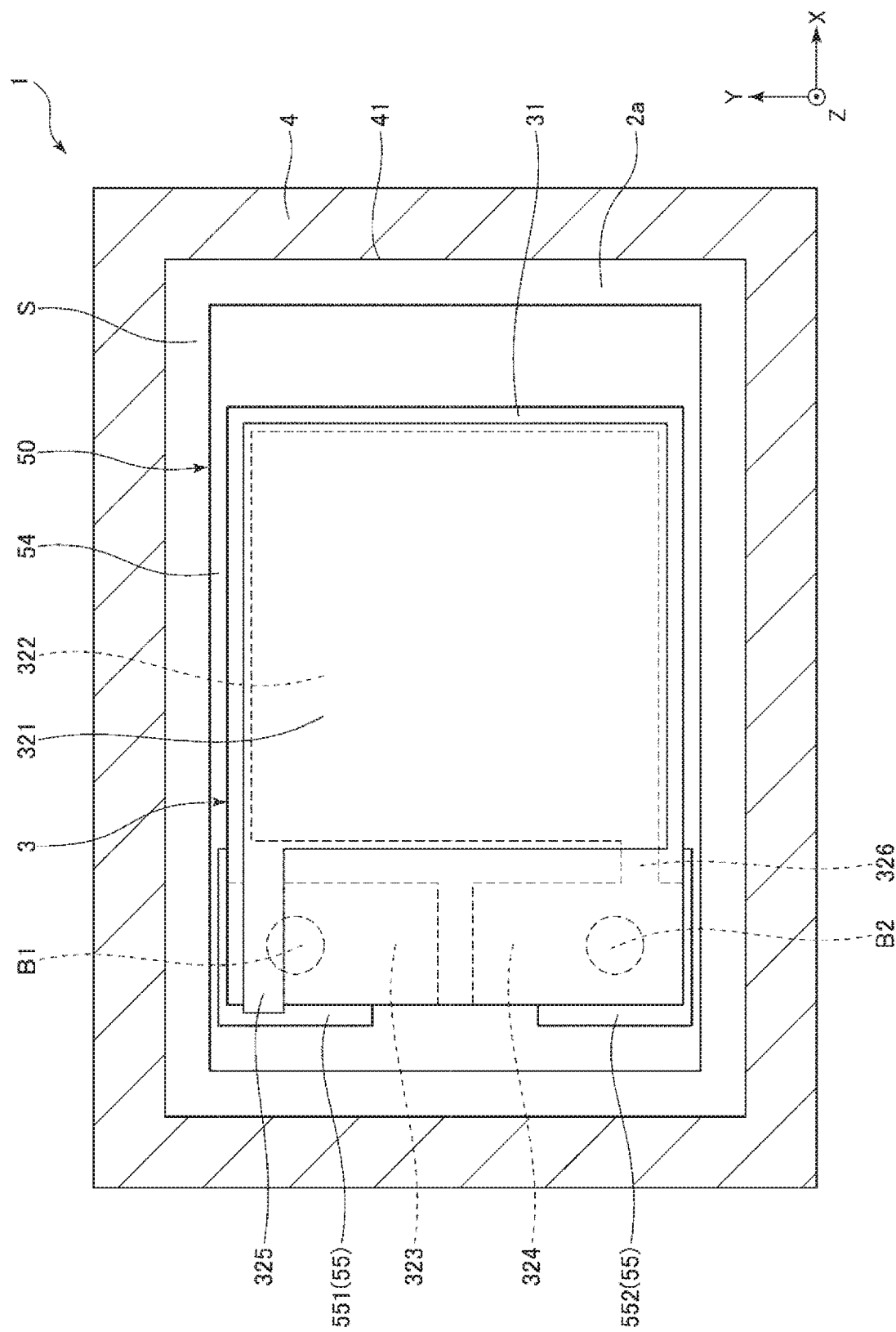
FIG. 5 is a plan view showing a vibration element.
Figure 6:
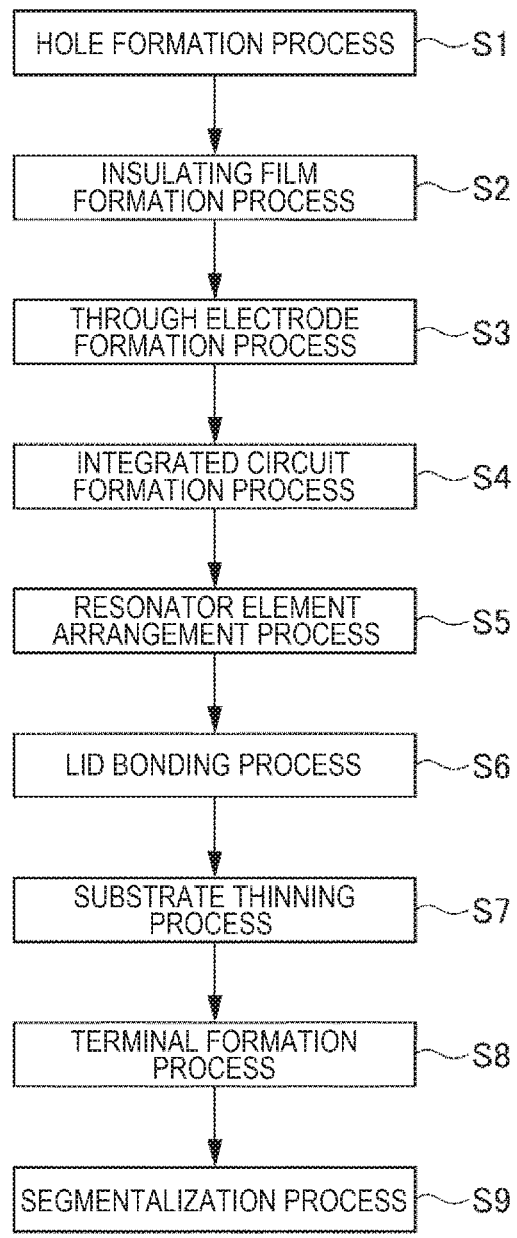
FIG. 6 is a diagram showing a manufacturing process of the vibration device shown in FIG. 1.

FIG. 1 is a cross-sectional view showing the vibration device according to a first embodiment. FIG. 2 is a bottom view of abase substrate. FIG. 3 is a cross-sectional view showing a coupling state between a through electrode and a terminal. FIG. 4 is a cross-sectional view showing a capacitor formed in the base substrate. FIG. 5 is a plan view showing a vibration element. FIG. 6 is a diagram showing a manufacturing process of the vibration device shown in FIG. 1. FIG. 7 through FIG. 15 are each a cross-sectional view for explaining a method of manufacturing the vibration device. It should be noted that in FIG. 1 through FIG. 5, there are illustrated three axes perpendicular to each other as an X axis, a Y axis, and a Z axis for the sake of convenience of explanation. Further, the side to which the arrow in the Z-axis direction points is also referred to as an "upper side," and the opposite side is also referred to as a "lower side." Further, the plan view along the Z axis is also referred to simply as a "plan view." Further, in the following description, the expressions "forming something on an upper surface" and "disposing something on an upper surface" include when forming or disposing something at a position a predetermined distance distant from the upper surface, namely when "forming something on the upper surface side" or "disposing something on the upper surface side" in addition to when forming or disposing something directly on the upper surface. The same applies to the lower surface.

The vibration device 1 shown in FIG. 1 has a base substrate 2, a vibration element 3 disposed on an upper surface of the base substrate 2, and a lid 4 bonded to the upper surface of the base substrate 2 so as to cover the vibration element 3.

The base substrate 2 is a silicon substrate as a semiconductor substrate. It should be noted that the base substrate 2 is not particularly limited, and it is possible to use a semiconductor substrate other than silicon such as a semiconductor substrate made of, for example, Ge, Gap, GaAs, or InP.

Further, the base substrate 2 has the upper surface 2a as a first surface and a lower surface 2b as a second surface, wherein the first surface and the second surface are in an obverse-reverse relationship, and the surface of the base substrate 2 is covered with an insulating film 20. Further, on the upper surface 2a, there is formed an integrated circuit electrically coupled to the vibration element 3. The integrated circuit 5 has an element separation area T1 and an activation area T2 surrounded by the element separation area T1, and in the activation area T2, there is formed an active element not shown such as a transistor. By providing the integrated circuit 5 to the base substrate 2, it is possible to effectively use a space in the base substrate 2. In particular, by forming the integrated circuit 5 on the upper surface 2a, it is possible to dispose the integrated circuit 5 within a housing space S described later, and thus, it is possible to protect the integrated circuit 5 from an external environment. The integrated circuit 5 is not particularly limited, and there can be cited, for example, an oscillation circuit for oscillating the vibration element 3 to generate the frequency of a reference signal such as a clock signal.

Further, on the upper surface 2a of the base substrate 2, there is disposed a stacked body 50 having an insulating layer 51, a wiring layer 52, an insulating layer 53, a passivation film 54, and a terminal layer 55 stacked on one another, a plurality of active elements not shown formed on the upper surface 2a is electrically coupled via a wiring included in the wiring layer 52, and thus the integrated circuit 5 is constituted. The terminal layer 55 includes a pair of terminals 551, 552 which are electrically coupled to the wiring layer 52, and are for achieving electrical coupling to the vibration element 3. It should be noted that although there is assumed the configuration in which the single wiring layer 52 is included in the stacked body 50 for the sake of convenience of explanation, this is not a limitation, and it is possible to stack two or more wiring layers 52 stacked on one another via the insulating layers 53. In other words, it is possible to alternately stack the wiring layer 52 and the insulating layer 53 a plurality of times between the insulating layer 51 and the passivation film 54.

Further, on the lower surface 2b of the base substrate 2, there is disposed a plurality of terminals 56. These terminal 56 function as external coupling terminals for achieving electrical coupling to external electronic equipment such as a circuit board. Further, the plurality of terminals 56 includes a terminal 561 as a first terminal, and terminals 562, 563 as second terminals. The terminal 561 is a terminal coupled to a substrate potential, the terminal 562 is a terminal coupled to a power supply for the integrated circuit 5, and the terminal 563 is a terminal through which an oscillation signal from the integrated circuit 5 is output. It should be noted that the number and the usage of the terminals 56 are not particularly limited, but can arbitrarily set in accordance with the configuration of the integrated circuit 5. When the base substrate 2 is a P-type silicon substrate having the P-type conductive property, the terminal 561 is coupled to the ground GND, and a drive voltage VDD is applied to the terminal 562. On the contrary, when the base substrate 2 is an N-type silicon substrate having the N-type conductive property, the terminal 562 is coupled to the ground GND, and the drive voltage VDD is applied to the terminal 561. It should be noted that in the present embodiment, the base substrate 2 is formed of the P-type silicon substrate.

Further, the terminal 561 is electrically coupled to the integrated circuit 5 via a through electrode 571 as a first through electrode penetrating the base substrate 2 in the thickness direction, the terminal 562 is electrically coupled to the integrated circuit 5 via a through electrode 572 as a second through electrode penetrating the base substrate 2 in the thickness direction, and the terminal 563 is electrically coupled to the integrated circuit 5 via a through electrode 573 as the second through electrode penetrating the base substrate in the thickness direction. It should be noted that the through electrode 571 is electrically coupled to an area for supplying the substrate potential via the wiring layer 52, and the through electrodes 572, 573 are electrically coupled to a circuit element in the activation area T2 via the wiring layer 52. These through electrodes 571, 572, and 573 are each formed by filling a hole 21 which penetrates the base substrate 2 in the thickness direction, and is provided with the insulating film 20 formed on the inside wall with an electrically-conductive material. Further, each of the through electrodes 571, 572, and 573 is formed so as not to overlap the element separation area T1, but to overlap the activation area T2.

As shown in FIG. 2, in each of the through electrodes 571, 572, and 573, the length L1 in a direction along the Y axis is longer than the width W1 as the length in a direction along the X axis in a plan view from a direction along the Z axis, in particular in the present embodiment, the through electrodes 571, 572, and 573 each have a rectangular shape. In other words, L1>W1 is fulfilled. By adopting such a shape, it is possible to increase the cross-sectional areas of the through electrodes 571, 572, and 573 to decrease the electrical resistances of the through electrodes 571, 572, and 573 while preventing the growth in size of the vibration device 1.

It should be noted that the configuration of the through electrodes 571, 572, and 573 is not particularly limited. For example, at least one of the through electrodes 571, 572, and 573 can be bent or curved in the middle, or can change in width in the middle. Further, at least one of the through electrodes 571, 572, and 573 can be different in longitudinal axis. For example, the longitudinal axis can extend along the X axis, or can cross both of the X axis and the Y axis. Further, at least one of the through electrodes 571, 572, and 573 can be provided with a shape having the length and the width equal to each other such as a square shape or a circular shape.

Then, the coupling parts between the terminals 561, 562, and 563 and the through electrodes 571, 572, and 573 will be described. As described above, the insulating film 20 is formed on the lower surface 2b of the base substrate 2, and the terminals 561, 562, and 563 are disposed on the lower surface of the insulating film 20. As shown in FIG. 1 and FIG. 2, the insulating film 20 is provided with through holes 201, 201, and 203 formed in the portions overlapping the respective through electrodes 571, 572, and 573, and the terminals 561, 562, and 563 and the through electrodes 571, 572, and 573 are electrically coupled to each other via these through holes 201, 202, and 203, respectively.

As shown in FIG. 2, the width W2 as the length in a direction along the X axis of the through holes 201, 202, and 203 is larger than the width W1 of the through electrodes 571, 572, and 573. The reason that W2>W1 is made true is for accepting the displacement of the through holes 201, 202, and 203. Specifically, the through holes 201, 202, and 203 are formed by etching the insulating film 20 deposited on the entire area of the lower surface 2b. Therefore, W2>W1 is made true for forming the through holes 201, 202, and 203 at the positions overlapping the through electrodes 571, 572, and 573 even when the mask used when performing the etching is shifted in some degree in a direction along the X axis from the setting position. On the other hand, the length L2 in a direction along the Y axis of the through holes 201, 202, and 203 is shorter than the length L1 of the through electrodes 571, 572, and 573. The reason that L2<L1 is made true is as follows. That is, since the through electrodes 571, 572, and 573 each have a longitudinal shape extending along the Y axis, it is possible to form the through holes 201, 202, and 203 at the positions overlapping the through electrodes 571, 572, and 573 even when the mask is shifted in some degree in the direction along the Y axis, and therefore, there is no need to prepare a long length as the length L1.

As described above, when W2>W1 is made true, it is possible to electrically couple the terminals 561, 562, and 563 and the through electrodes 571, 572, and 573 to each other with a higher certainty via the through holes 201, 202, and 203, but on the contrary, the following problem arises. That is, when W2>W1 is made true, as shown in FIG. 3, the terminals 561, 562, and 563 have contact not only with the through electrodes 571, 572, and 573 but also with the base substrate 2, and the terminals 561, 562, and 563 and the base substrate 2 are electrically coupled to each other. Therefore, an electrical current of a drive signal or the oscillation signal is leaked from the terminals 561, 562, and 563 to the base substrate 2 via the contact portion P, and thus, the characteristics and the reliability of the integrated circuit 5 deteriorate. Therefore, in the vibration device 1, there is provided the device for preventing the current leakage to the base substrate 2 from having a harmful influence on the characteristics and the reliability of the integrated circuit 5. The detailed description will hereinafter be presented.

As shown in FIG. 1 and FIG. 2, the base substrate 2 is provided with frames 92, 93 each of which surrounds a part of the base substrate 2 in a plan view from the direction along the Z axis, penetrates the base substrate 2 in the thickness direction, and has an insulating property. The frames 92, 93 each insulate an area Q1 inside the frame and an area Q2 outside the frame from each other in the base substrate 2.

The frames 92, 93 each have a hole 23 penetrating the base substrate 2 in the thickness direction, the insulating film 20 disposed on the inside wall of the hole 23, and an electrically-conductive part 24 made of an electrically-conductive material filling the hole 23. In other words, the frames 92, 93 are substantially the same in configuration as the through electrodes 571, 572, and 573. Therefore, it is possible to form the frames 92, 93 and the through electrodes 571, 572, and 573 in a lump, and thus, the complication of the manufacturing of the vibration device 1 is prevented. It should be noted that the configuration of the frames 92, 93 is not particularly limited providing the frames 92, 93 can insulate the areas Q1, Q2 from each other. For example, it is possible to fill the hole 23 with an insulating material instead of the electrically-conductive material. Further, it is also possible to fill the hole 23 with the insulating film 20 alone without filling the hole 23 with the electrically-conductive material.

As shown in FIG. 2, the through electrode 572 for supplying the integrated circuit 5 with the power is disposed inside the frame 92. Further, in the plan view from the direction along the Z axis, the entire area of the through hole 202 overlapping the through electrode 572 is located inside the frame 92. Therefore, the terminal 562 is electrically coupled to the area Q1 located inside the frame 92 of the base substrate 2 via the through hole 202. Therefore, even when the power is leaked to the base substrate 2 via the terminal 562, the leakage is retained in the area Q1, and the leakage to the outside of the area Q1, namely the area Q2, is effectively prevented. It should be noted that the frame 92 is formed large enough to be able to dispose the entire area of the through hole 202 inside the frame 92 even when the displacement of the through hole 202 occurs.

Similarly, the through electrode 573 for taking out the oscillation signal from the integrated circuit 5 is disposed inside the frame 92. Further, in the plan view from the direction along the Z axis, the entire area of the through hole 203 overlapping the through electrode 573 is located inside the frame 93. Therefore, the terminal 563 is electrically coupled to the area Q1 located inside the frame 93 of the base substrate 2 via the through hole 203. Therefore, even when the oscillation signal is leaked to the base substrate 2 via the terminal 563, the leakage is retained in the area Q1, and the leakage to the outside of the area Q1, namely the area Q2, is effectively prevented. It should be noted that the frame 93 is formed large enough to be able to dispose the entire area of the through hole 203 inside the frame 92 even when the displacement of the through hole 203 occurs.

As described above, by surrounding the through electrodes 572, 573 with the frames 92, 93, it is possible to prevent the leakage of the power and the oscillation signal to the area Q2. Therefore, by forming the circuit elements provided to the integrated circuit 5 in the area Q2 of the activation area T2, it is possible to ensure the characteristics and the reliability of the integrated circuit 5.

In contrast, the through electrode 571 for supplying the integrated circuit 5 with the substrate potential 571 is disposed outside the frames 92, 93. Therefore, the terminal 561 is electrically coupled to the area Q2 located outside the frames 92, 93 of the base substrate 2 via the through hole 203. Therefore, although the substrate potential is leaked to the area Q2 of the base substrate 2 via the terminal 561, it does not matter since the substrate potential to be leaked is the same potential as that of the base substrate 2. As described above, regarding the terminal 561 and the through electrode 571 in which the leakage does not matter, the periphery is not surrounded by the frame, and thus, it is possible to achieve the reduction in side of the vibration device 1. In other words, according to the vibration device 1 related to the present embodiment, it is possible to ensure the characteristics and the reliability of the integrated circuit 5, and at the same time, it is possible to achieve the reduction in size.

In particular, in the present embodiment, as shown in FIG. 2, the through electrode 572 is coupled to the frame 92 in the both end parts, and is thus electrically coupled to the electrically-conductive part 24. Thus, as shown in FIG. 4, a capacitor C1 functioning as a bypass capacitor is formed between the electrically-conductive part 24 and the area Q2 of the base substrate 2 coupled to the ground GND as the substrate potential. Therefore, the supply of the power to the integrated circuit 5 is stabilized. It should be noted that this is not a limitation, and for example, it is possible for the through electrode 572 to be coupled to the frame 92 in one end part of the through electrode 572. Further, it is also possible for the through electrode 572 not to be coupled to the frame 92, and to be insulated from the electrically-conductive part 24.

In contrast, as shown in FIG. 2, the through electrode 573 has no contact with the frame 93, and is not coupled to the frame 93. Therefore, the through electrode 573 and the electrically-conductive part 24 inside the frame 93 are electrically isolated from each other. Thus, a capacitor such as the capacitor C1 described above is not formed between the electrically-conductive part 24 and the area Q2 of the base substrate 2. Therefore, it becomes difficult for the noise to be superimposed on the oscillation signal taken out through the terminal 563, and thus, it is possible to obtain the oscillation signal high in S/N ratio (Signal to Noise Ratio). It should be noted that this is not a limitation, and for example, it is possible for the through electrode 573 to electrically be coupled to the electrically-conductive part 24 inside the frame 93.

As described above, even in the through electrodes 572, 573 having the feature of being disposed inside the frame 92, 93 in common, by varying the configurations in accordance with the intended purpose, it is possible to obtain the vibration device 1 higher in accuracy.

The lid 4 is a silicon substrate similarly to the base substrate 2. Thus, the base substrate 2 and the lid 4 become equal in linear expansion coefficient to each other to prevent the thermal stress caused by the thermal expansion from occurring, and thus, the vibration device 1 having the excellent vibration characteristics is obtained. Further, since it is possible to form the vibration device 1 with the semiconductor process, the vibration device 1 can accurately be manufactured, and at the same time, it is possible to achieve reduction in size thereof. It should be noted that the lid 4 is not particularly limited, and it is possible to use a semiconductor substrate other than silicon such as a semiconductor substrate made of, for example, Ge, Gap, GaAs, or InP.

The lid 4 has a recessed part 41 as a bottomed recessed part which opens in the lower surface of the lid 4, and houses the vibration element 3 inside. Further, a lower surface of the lid 4 is bonded to the upper surface 2a of the base substrate 2 via a bonding member 6. Thus, the housing space S for housing the vibration element 3 is formed between the lid 4 and the base substrate 2. The housing space S is airtightly sealed, and is set in a reduced-pressure state, and more preferably, in a state approximate to a vacuum state. Thus, the vibration characteristics of the vibration element 3 are improved. It should be noted that the atmosphere in the housing space S is not particularly limited, but can be an atmosphere filled with an inert gas such as nitrogen or Ar, or can be in the atmospheric pressure state or a pressurized state instead of the reduced-pressure state.

As shown in FIG. 5, the vibration element 3 has a vibration substrate 31 and electrodes disposed on a surface of the vibration substrate 31. The vibration substrate 31 has a thickness-shear vibration mode, and is formed of an AT-cut quartz crystal substrate in the present embodiment. Since the AT-cut quartz crystal substrate has the third-order frequency-temperature characteristic, the vibration element 3 having the excellent temperature characteristic is obtained. Further, the electrodes include an excitation electrode 321 disposed on an upper surface of the vibration substrate 31, and an excitation electrode 322 disposed on a lower surface so as to be opposed to the excitation electrode 321. Further, the electrodes include a pair of terminals 323, 324 disposed on the lower surface of the vibration substrate 31, an interconnection 325 for electrically coupling the terminal 323 and the excitation electrode 321 to each other, and an interconnection 326 for electrically coupling the terminal 324 and the excitation electrode 322 to each other.

It should be noted that the configuration of the vibration element 3 is not limited to the configuration described above. For example, the vibration element 3 can be provided with a mesa structure in which a vibration area sandwiched between the excitation electrodes 321, 322 protrudes from the periphery of the vibration area, or can also be provided with an inverted-mesa structure in which the vibration area is recessed from the periphery of the vibration area, on the contrary. Further, it is also possible to perform a bevel treatment for grinding the periphery of the vibration substrate 31, or a convex treatment for changing the upper surface and the lower surface to a convex surface.

Further, the vibration element 3 is not limited to one vibrating in the thickness-shear vibration mode, and can be, for example, a vibration element having a plurality of vibrating arms making a flexural vibration in an in-plane direction. In other words, the vibration substrate 31 is not limited to one formed of the AT-cut quartz crystal substrate, and can also be formed of a quartz crystal substrate other than the AT-cut quartz crystal substrate such as an X-cut quartz crystal substrate, a Y-cut quartz crystal substrate, a Z-cut quartz crystal substrate, a BT-cut quartz crystal substrate, an SC-cut quartz crystal substrate, or an ST-cut quartz crystal substrate. Further, the vibration substrate 31 is formed of the quartz crystal in the present embodiment, but this is not a limitation, and it is possible for the vibration substrate 31 to be formed of a piezoelectric single-crystal body made of, for example, lithium niobate, lithium tantalate, lithium tetraborate, langasite, potassium niobate, or gallium phosphate, or to be formed of another piezoelectric single-crystal body than these. Furthermore, the vibration element 3 is not limited to the piezoelectrically-actuated vibration element, but can be an electrostatically-actuated vibration element using electrostatic force.

Such a vibration element 3 is fixed to the upper surface 2a of the base substrate 2, more specifically, to the upper surface of the stacked body 50, with bonding members B1, B2 having electrical conductivity. Further, the bonding member B1 electrically couples the terminal 551 provided to the stacked body 50 and the terminal 323 provided to the vibration element 3 to each other, and the bonding member B2 electrically couples the terminal 552 provided to the stacked body 50 and the terminal 324 provided to the vibration element 3 to each other. Thus, the vibration element 3 and the integrated circuit 5 are electrically coupled to each other.

The bonding members B1, B2 are not particularly limited as long as both of the electrical conductivity and the bonding property are provided, and it is possible to use, for example, a variety of metal bumps such as gold bumps, silver bumps, copper bumps, or solder bumps, or an electrically conductive adhesive having an electrically conductive filler such as a silver filler dispersed in a variety of adhesives such as a polyimide type adhesive, an epoxy type adhesive, a silicone type adhesive, or an acrylic adhesive. When using the metal bumps which are in the former group as the bonding members B1, B2, it is possible to suppress generation of a gas from the bonding members B1, B2, and it is possible to effectively prevent a change in environment, in particular rise in pressure, of the housing space S. On the other hand, when using the electrically conductive adhesive which is in the latter group as the bonding members B1, B2, the bonding members B1, B2 become soft compared to the metal bumps, and it becomes difficult for a stress to reach the vibration element 3.

Hereinabove, the vibration device 1 is briefly described. As described above, such a vibration device 1 has the base substrate 2 as the semiconductor substrate having the upper surface 2a as the first surface and the lower surface 2b as the second surface wherein the first surface and the second surface are in the obverse-reverse relationship, the integrated circuit 5 disposed on the upper surface 2a, the terminal 561 as the first terminal which is disposed on the lower surface 2b, and to which the substrate potential is applied, the terminals 562, 563 as the second terminals which are disposed on the lower surface 2b, and to which the potentials different from the substrate potential are respectively applied, the through electrode 571 as the first through electrode penetrating the base substrate 2 to electrically couple the terminal 561 and the integrated circuit 5 to each other, the through electrodes 572, 573 as the second through electrodes penetrating the base substrate to electrically couple the terminals 562, 563 and the integrated circuit 5 to each other, the frames 92, 93 which penetrate the base substrate and have the insulating property, the vibration element 3 disposed on the upper surface 2a, and the lid 4 as the lid bonded to the upper surface 2a. Further, the through electrode 571 is located outside the frames 92, 93, and the through electrodes 572, 573 are located inside the frames 92, 93, respectively.

By disposing the through electrodes 572, 573 coupled to the terminals 562, 563 having the different potentials from the substrate potential inside the frames 92, 93, respectively, as described above, even when the electrical current is leaked to the base substrate 2 from the terminals 562, 563 or the through electrodes 572, 573, the leakage is retained in the area Q1 located inside the frames 92, 93, and thus, the leakage to the outside of the area Q1, namely the area Q2 outside the frames 92, 93, is effectively prevented. Therefore, the characteristics and the reliability of the integrated circuit 5 can be ensured. Further, since there is no problem when the substrate potential is leaked to the base substrate 2 from the terminal 561 or the through electrode 571, the frame is not disposed on the periphery of the through electrode 571, and thus, it is possible to achieve the reduction in size of the vibration device 1.

Further, as described above, the vibration device 1 has the through holes 202, 203, and has the insulating film 20 disposed between the lower surface 2b and the terminals 562, 563, and the terminals 562, 563 are electrically coupled to the through electrodes 571, 572 via the through holes 202, 203, respectively. Thus, it is possible to electrically couple the terminals 562, 563 and the through electrodes 572, 573 respectively to each other while insulating the terminals 562, 563 and the base substrate 2 from each other.

Further, as described above, the width W2 of the through holes 202, 203 is larger than the width W1 of the through electrodes 572, 573, the through holes 202, 203 are surrounded by the frames 92, 93, respectively, in the plan view, and the terminals 562, 563 are electrically coupled to the areas Q1 located inside the frames 92, 93 of the base substrate 2 via the through holes 202, 203, respectively. As described above, by making W2>W1 true, it is possible to accept the displacement of the through holes 202, 203, and it is to electrically couple the terminals 562, 563 and the through electrodes 572, 573 to each other with a higher certainty. Further, although the electrical current is leaked from the portions having contact with the base substrate 2 of the terminals 562, 563, since the through holes 202, 203 are respectively surrounded by the frames 92, 93, the leakage is retained in the area Q1, and thus, the leakage to the outside of the area Q1, namely to the area Q2, is effectively prevented. Therefore, it is possible to prevent the deterioration of the characteristics and the reliability of the integrated circuit.

Further, as described above, the frames 92, 93 each have the hole 23 penetrating the base substrate 2, the insulating film 20 disposed on the inside surface of the hole 23, and the electrically-conductive part 24 made of an electrically-conductive material filling the hole 23. Thus, the configuration of the frames 92, 93 becomes simple. Further, since it is possible to form the frames 92, 93 in the same process as that of the through electrodes 571, 572, and 573 in a lump, the complication of the manufacturing of the vibration device 1 can be prevented.

Further, as described above, the integrated circuit 5 is supplied with the power via the terminal 562, and the through electrode 572 is electrically coupled to the electrically-conductive part 24 of the frame 92. Thus, since the capacitor C1 functioning as the bypass capacitor is formed between the electrically-conductive part 24 and the area Q2, it is possible to stably supply the integrated circuit 5 with the power.

Further, as described above, the signal from the integrated circuit 5, namely the oscillation signal in the present embodiment, is output via the terminal 563, and the through electrode 573 is not electrically coupled to the electrically-conductive part 24 of the frame 93. Thus, it becomes difficult for the noise to be superimposed on the oscillation signal, and it is possible to take out the oscillation signal high in S/N ratio.

Further, as described above, the through electrodes 572, 573 each have the longitudinal shape in the plan view of the base substrate 2. In other words, the length L1 of the through electrodes 571, 573 is longer than the width W1 of the through electrodes 572, 573. By adopting such a shape, it is possible to increase the cross-sectional areas of the through electrodes 572, 573 to decrease the electrical resistances of the through electrodes 572, 573 while preventing the growth in size of the vibration device 1.

Then, the method of manufacturing the vibration device 1 will be described with reference to FIG. 6 through FIG. 15. As shown in FIG. 6, the method of manufacturing the vibration device 1 includes a hole formation process S1 of forming the holes 21, 23 opening in the upper surface 2a of the base substrate 2, an insulating film formation process S2 of forming the insulating film 20 on the inner surfaces of the holes 21, 23, a through electrode formation process S3 of filling the holes 21, 23 with the electrically-conductive material to form the through electrodes 571, 572, and 573 and the electrically-conductive parts 24, an integrated circuit formation process S4 of forming the integrated circuit 5 on the upper surface 2a of the base substrate 2, a vibration element arrangement process S5 of arranging the vibration element 3 on the upper surface 2a of the base substrate 2, a lid bonding process S6 of bonding the lid 4 covering the vibration element 3 to the base substrate 2, a substrate thinning process S7 of thinning the base substrate 2, a terminal formation process S8 of forming the terminals 561, 562, and 563 on the lower surface 2b of the base substrate 2, and a segmentalization process S9. Hereinafter, each of these processes S1 through S9 will sequentially be described in detail. It should be noted that the dotted lines shown in FIG. 7 through FIG. 14 represent portions to be cut or removed before the vibration device 1 is completed.

Hole Formation Process S1

Figure 7:
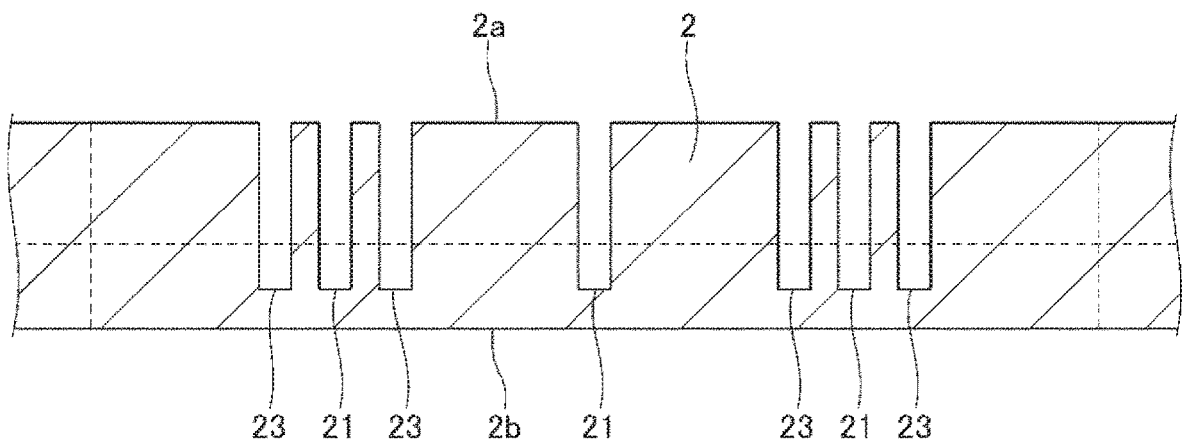
FIG. 7 is a cross-sectional view for explaining a method of manufacturing the vibration device.

As shown in FIG. 7, the base substrate 2 included in a silicon wafer is prepared, and then the holes 21, 23 opening in the upper surface 2a of the base substrate 2 are formed in the base substrate 2. The base substrate 2 prepared here is thicker than the base substrate 2 in the state in which the vibration device has become a completed product shown in FIG. 1. Thus, the strength of the base substrate 2 increases to increase the handling in the manufacturing process. Further, the holes 21, 23 are each formed of a bottomed recessed part deeper than the thickness of the base substrate 2 in the state in which the vibration device has become the completed product shown in FIG. 1, and do not penetrate to the lower surface 2b of the base substrate 2. By forming the hole 21 as the bottomed recessed part, the formation time of the hole 21 shortens compared to, for example, when making the hole 21 penetrate to the lower surface 2b. Further, it becomes easy to fill the holes 21, 23 with the electrically-conductive material in the through electrode formation process S3, and thus, it becomes easy to form the through electrodes 571, 572, and 573 and the electrically-conductive parts 24.

It should be noted that the method of forming the holes 21, 23 is not particularly limited, and it is possible to form the holes 21, 23 by, for example, dry etching, in particular, a Bosch process. Thus, it is possible to form the holes 21, 23 high in aspect ratio, and it is possible to achieve the reduction in size of the vibration device 1. It should be noted that this is not a limitation, and it is also possible to make the hole 21 penetrate to the lower surface 2b in the present process. Further, it is preferable to equalize the widths of the holes 21, 23. Thus, the etching ratio is equalized, and it is possible to form the holes 21, 23 in a balanced manner.

Insulating Film Formation Process S2

Figure 8:
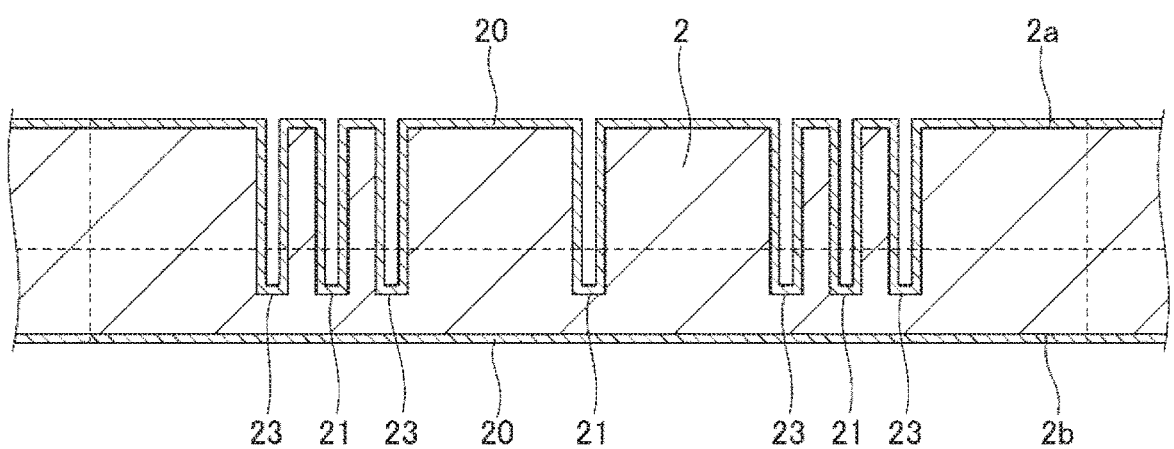
FIG. 8 is a cross-sectional view for explaining the method of manufacturing the vibration device.

As shown in FIG. 8, the base substrate 2 is thermally oxidized to form the insulating film 20 made of silicon oxide ($SiO_2$) on the surfaces of the base substrate 2, in particular, on the inner surfaces of the holes 21, 23. By forming the insulating film 20 using thermal oxidation, it is possible to form the insulating film 20 which is precise and homogenous on the surfaces of the base substrate 2. Further, it is also possible to reduce a difference in linear expansion coefficient between the insulating film 20 and the base substrate 2. Therefore, the thermal stress is hard to occur, and thus, the vibration device 1 having the excellent oscillation characteristics is obtained. It should be noted that the constituent material of the insulating film 20 is not particularly limited, but can be formed of, for example, silicon nitride (SiN). Further, the method of forming the insulating film 20 is not limited to the thermal oxidation, and it is possible to form the insulating film 20 using, for example, a CVD process.

Through Electrode Formation Process S3

Figure 9:
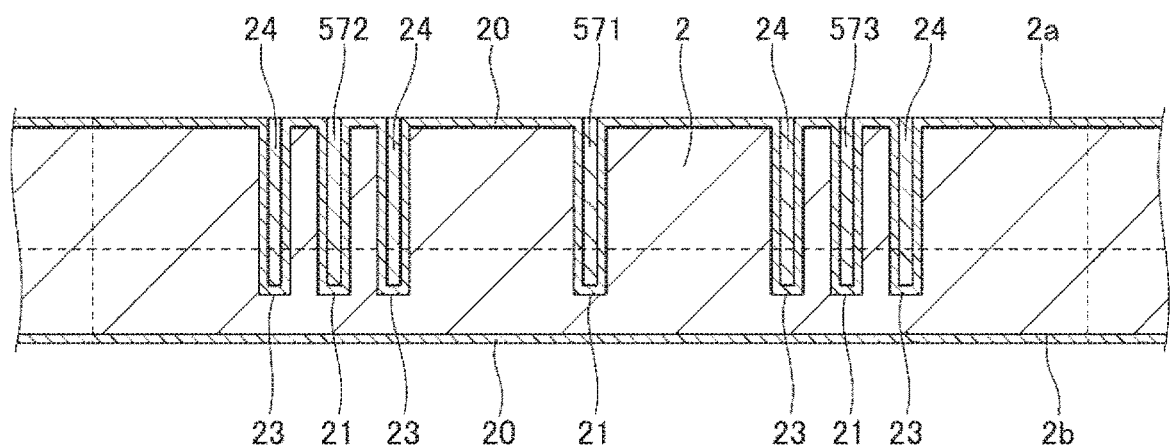
FIG. 9 is a cross-sectional view for explaining the method of manufacturing the vibration device.

As shown in FIG. 9, the holes 21, 23 are filled with the electrically-conductive material to form the through electrodes 571, 572, and 573 and the electrically-conductive parts 24 each penetrating the base substrate 2 when the vibration device is completed although not penetrating in this state. It should be noted that the electrically-conductive material is not particularly limited, but in the present embodiment, there is used electrically-conductive polysilicon. The electrically-conductive polysilicon means polysilicon doped with an impurity such as phosphorus (P), boron (B), or arsenic (As) to thereby be provided with electrical conductivity. By adopting polysilicon as the electrically-conductive material as described above, there are obtained the through electrodes 571, 572, and 573 and the electrically-conductive parts 24 sufficiently resistant to the heat to be applied in the subsequent integrated circuit formation process S4. Therefore, the electric failure due to the through electrodes 571, 572, and 573 becomes hard to occur. Further, it is also possible to reduce a difference in linear expansion coefficient from the base substrate 2. Therefore, the thermal stress is hard to occur, and thus, the vibration device 1 having the excellent oscillation characteristics is obtained. It should be noted that the electrically-conductive material is not particularly limited, and there can be used a metal material excellent in heat resistance such as tungsten (W).

Integrated Circuit Formation Process S4

Figure 10:
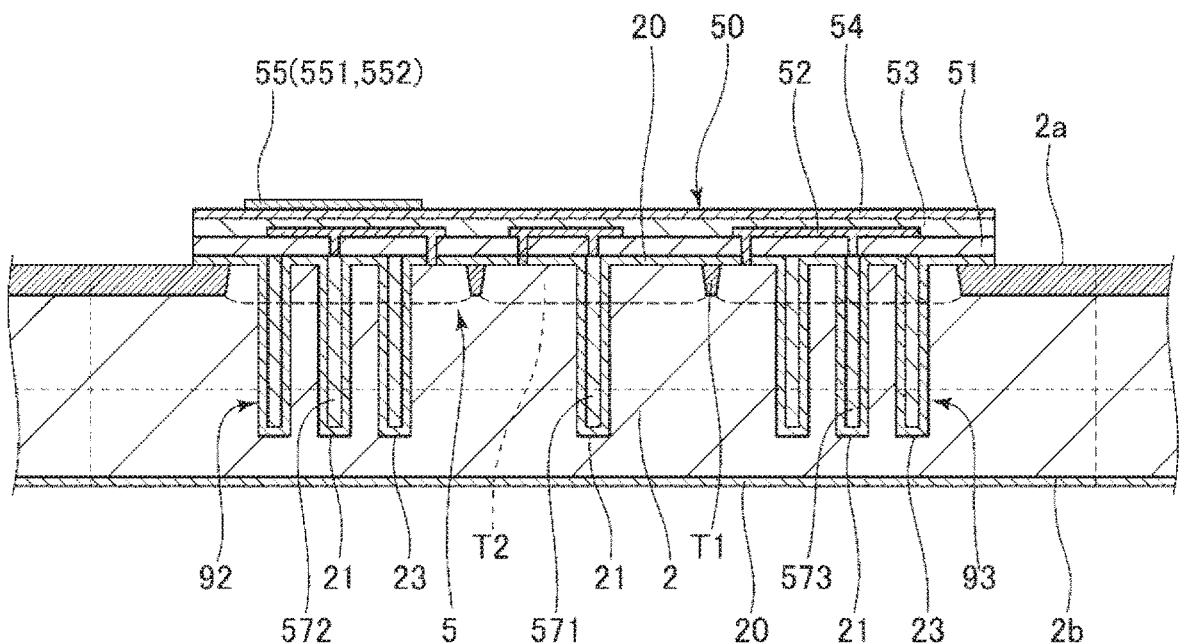
FIG. 10 is a cross-sectional view for explaining the method of manufacturing the vibration device.

As shown in FIG. 10, the element separation area T1 and the activation area 12 surrounded by the element separation area T1 are formed on the upper surface 2a side of the base substrate 2, and at least one active element not shown such as a transistor is formed in the activation area T2. It should be noted that the positions of the through electrodes 571, 572, and 573 are designed so that the through electrodes 571, 572, and 573 do not overlap the element separation area T1, in other words, so that the through electrodes 571, 572, and 573 overlap the activation area T2. Then, the insulating layer 51, the wiring layer 52, the insulating layer 53, the passivation film 54, and the terminal layer 55 are stacked in sequence on the upper surface 2a of the base substrate 2 to thereby form the stacked body 50. The stacked body 50 is formed on the upper surface 2a of the base substrate 2 except the bonding portion to the lid 4. In such a manner as described above, the integrated circuit 5 is formed.

By forming the integrated circuit 5 after forming the through electrodes 571, 572, and 573 and the electrically-conductive parts 24 as described above, it is possible to reduce the thermal damage (thermal history) to be incurred by the integrated circuit 5 during the manufacturing process. Specifically, in the method of forming the integrated circuit 5 and then forming the through electrodes 571, 572, and 573 and the electrically-conductive parts 24, the heat generated when forming the insulating film 20 and the heat generated when forming the through electrodes 571, 572, and 573 and the electrically-conductive parts 24 are applied to the integrated circuit 5. However, in the method according to the present embodiment, at least the heat generated when forming the insulating film 20 and the heat generated when forming the through electrodes 571, 572, and 573 and the electrically-conductive parts 24 are not applied to the integrated circuit 5. Therefore, it is possible to prevent the deterioration of the reliability of the integrated circuit 5. Further, by forming the through electrodes 571, 572, and 573 and the electrically-conductive parts 24 before forming the integrated circuit 5, it is possible to form the insulating film 20, the through electrodes 571, 572, and 573, and the electrically-conductive parts 24 in the appropriate temperatures without taking the thermal damage of the integrated circuit 5 into consideration. Therefore, the failure in forming the insulating film 20, and the through electrodes 571, 572, and 573 becomes hard to occur.

Each of the layers of the stacked body 50 can be formed using, for example, deposition by the CVD process and patterning by the etching process. In the present embodiment, the insulating layers 51, 53 are formed of silicon oxide ($SiO_2$), the wiring layer 52 and the terminal layer 55 are formed of electrically-conductive polysilicon, and the passivation film 54 is formed of silicon nitride (SiN). As described above, by forming each of the layers with the silicon-based materials, it is possible to decrease the difference in linear expansion coefficient between the stacked body 50 and the base substrate 2. Therefore, the thermal stress is hard to occur, and thus, the vibration device 1 having the excellent oscillation characteristics is obtained. It should be noted that the constituent material of each of the layers is not particularly limited.

Vibration Element Arrangement Process S5

Figure 11:
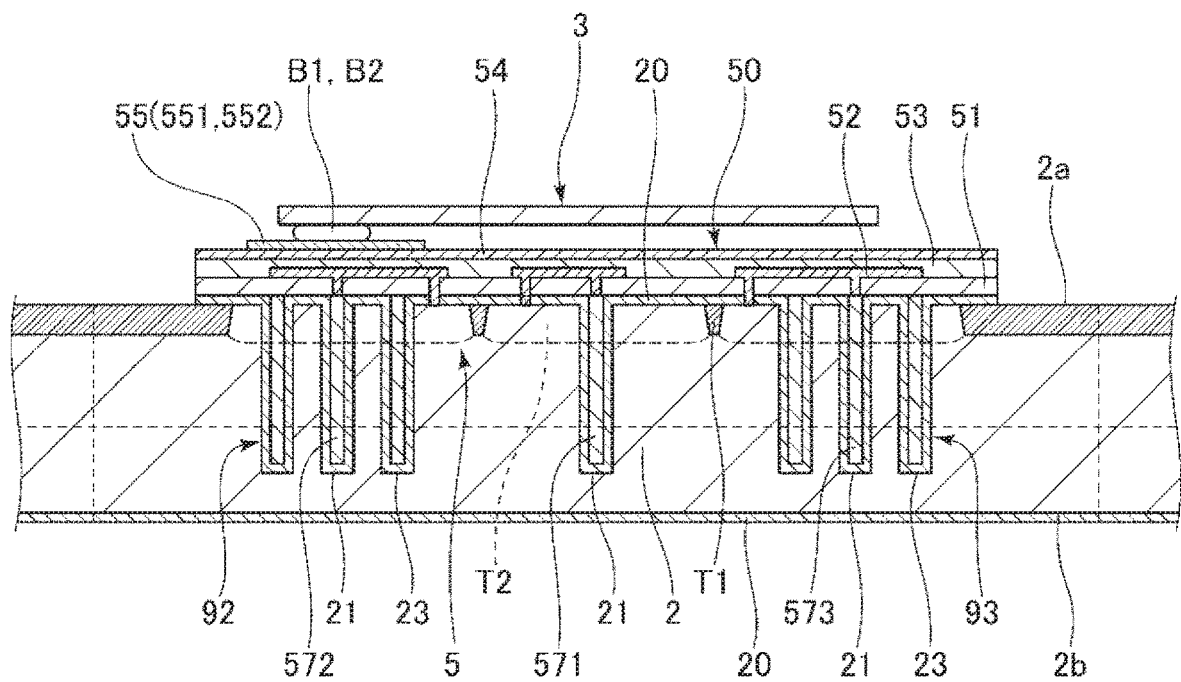
FIG. 11 is a cross-sectional view for explaining the method of manufacturing the vibration device.

As shown in FIG. 11, the vibration element 3 is prepared, and then the vibration element 3 is bonded to the upper surface 2a of the base substrate 2, specifically the upper surface of the stacked body 50, via the bonding members B1, B2. Further, the terminal 551 of the stacked body 50 and the terminal 323 of the vibration element 3 are electrically coupled to each other via the bonding member B1, and the terminal 552 of the stacked body 50 and the terminal 324 of the vibration element 3 are electrically coupled to each other via the bonding member B2. Thus, the vibration element 3 and the integrated circuit 5 are electrically coupled to each other.

Lid Bonding Process S6

Figure 12:
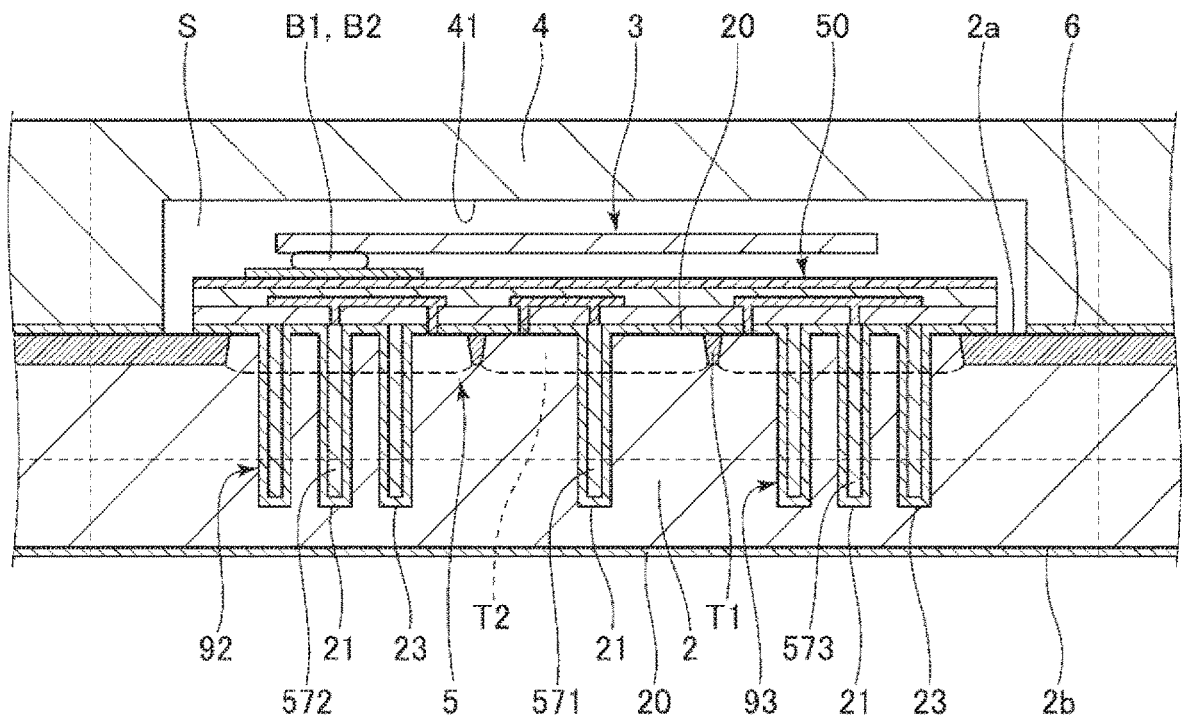
FIG. 12 is a cross-sectional view for explaining the method of manufacturing the vibration device.

As shown in FIG. 12, the lid 4 included in the silicon wafer is prepared, and is then bonded to the upper surface 2a of the base substrate 2 via the bonding member 6 in the reduced pressure environment. It should be noted that it is also possible to make the lid 4 prepared here thicker than the lid 4 in the state in which the vibration device 1 has become the completed product shown in FIG. 1, and then thin the lid 4 from the upper surface side after the subsequent terminal formation process S8 and before the segmentalization process S9. Thus, the strength of the lid 4 in the manufacturing process increases to increase the handling.

Substrate Thinning Process S7

Figure 13:
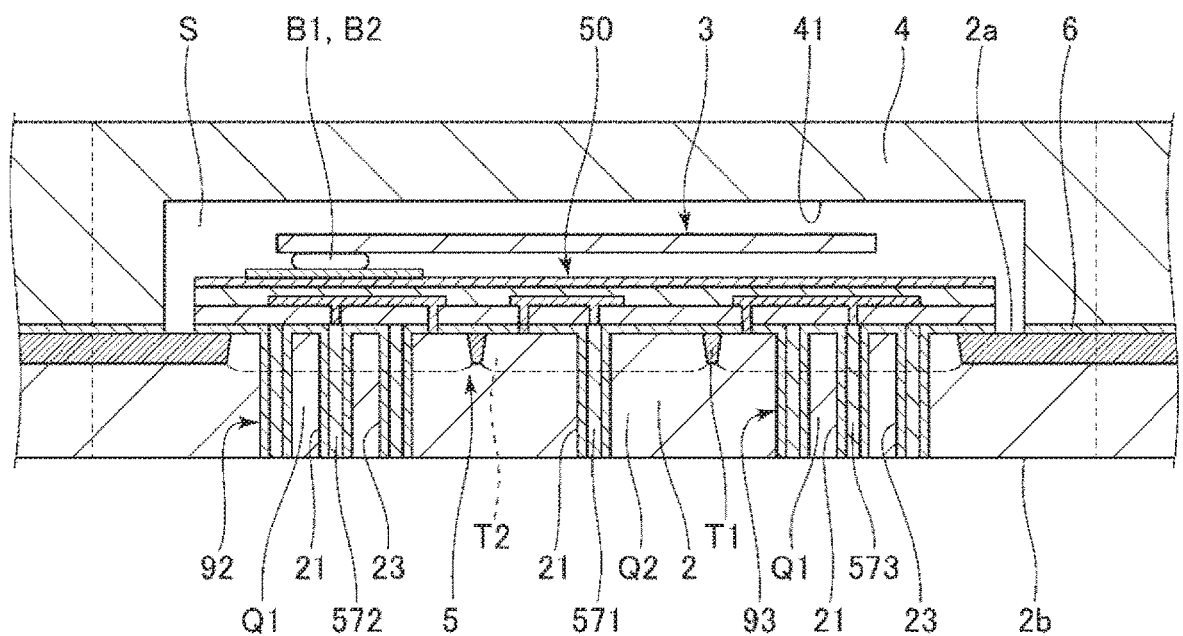
FIG. 13 is a cross-sectional view for explaining the method of manufacturing the vibration device.

As shown in FIG. 13, the base substrate 2 is thinned from the lower surface 2b side to make the holes 21, 23 penetrate to the lower surface 2b of the base substrate 2. The method of thinning the base substrate 2 is not particularly limited, and there can be used, for example, cutting, grinding, polishing, and etching. Further, as the method of grinding and polishing, there can be used, for example, back grinding, CMP (chemical mechanical polishing), and dry polishing in combination.

Terminal Formation Process S8

Figure 14:
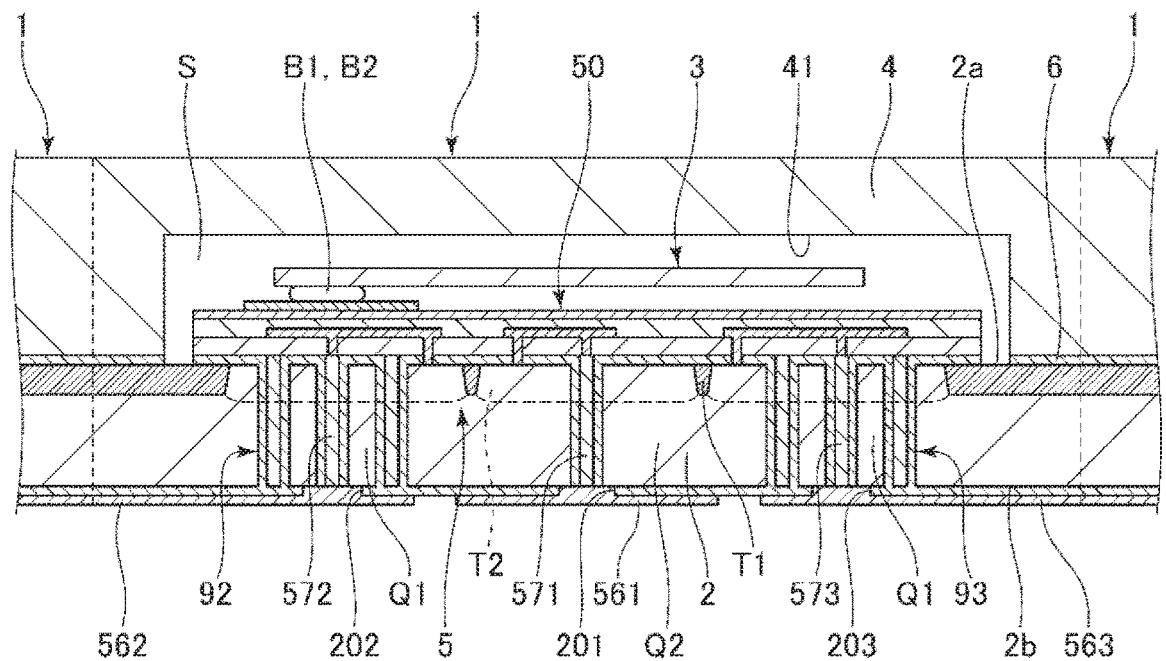
FIG. 14 is a cross-sectional view for explaining the method of manufacturing the vibration device.

As shown in FIG. 14, after forming the insulating film 20 on the lower surface 2b of the base substrate 2, the terminals 561, 562, and 563 are formed at the positions respectively overlapping the through electrodes 571, 572, and 573. Thus, the through electrodes 571, 572, and 573 and the terminals 561, 562, and 563 are electrically coupled to each other, respectively. Due to the processes described hereinabove, the plurality of vibration devices 1 is integrally formed on the silicon wafer.

Segmentalization Process S9

Figure 15:
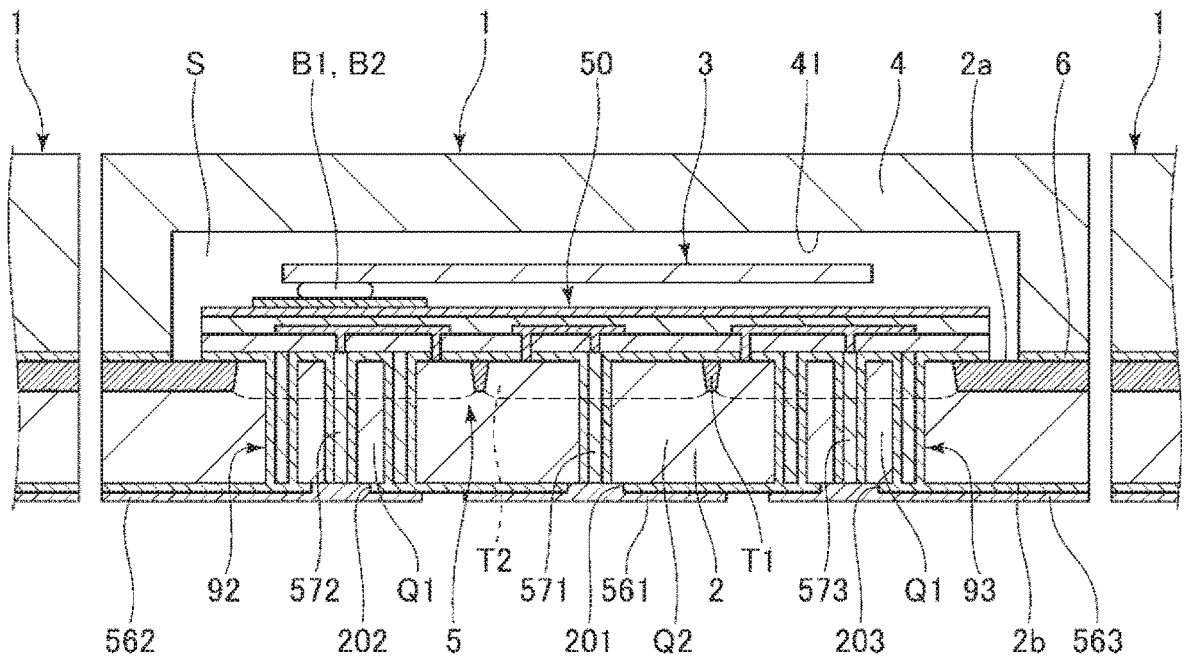
FIG. 15 is a cross-sectional view for explaining the method of manufacturing the vibration device.

As shown in FIG. 15, cutting by a dicing saw or the like is performed to cut out to thereby segmentalize the vibration devices 1. Due to the process described hereinabove, the vibration device 1 can be obtained.

Although the vibration device according to the present application example is described hereinabove based on the illustrated embodiments, the present application example is not limited to these embodiments, but the configuration of each of the components can be replaced with one having an identical function and an arbitrary configuration. Further, it is also possible to add any other constituents to the present application example. Further, the present application example can be a combination of any two or more configurations of the embodiments described above.

What is claimed is:

1. A vibration device comprising:
a semiconductor substrate having a first surface and a second surface in an obverse-reverse relationship;
an integrated circuit disposed on the first surface;
a first terminal which is disposed on the second surface and to which a substrate potential is applied;
a second terminal which is disposed on the second surface and to which a potential different from the substrate potential is applied;
a first through electrode which penetrates the semiconductor substrate, and is configured to electrically couple the first terminal and the integrated circuit to each other;
a second through electrode which penetrates the semiconductor substrate, and is configured to electrically couple the second terminal and the integrated circuit to each other;
a frame which penetrates the semiconductor substrate, and has an insulating property;
a vibration element disposed on the first surface; and
a lid bonded to the first surface, wherein
the first through electrode is located outside the frame, and
the second through electrode is located inside the frame.

2. The vibration device according to claim 1, further comprising:
an insulating film which has a through hole, and is disposed between the second surface and the second terminal, wherein
the second terminal is electrically coupled to the second through electrode via the through hole.

3. The vibration device according to claim 2, wherein
the through hole is larger in width than the second through electrode,
the through hole is surrounded by the frame in a plan view, and
the second terminal is electrically coupled to an area inside the frame of the semiconductor substrate via the through hole.

4. The vibration device according to claim 1, wherein
the frame includes
a hole penetrating the semiconductor substrate,
an insulating film disposed on an inner surface of the hole, and
an electrically-conductive material filling the hole.

5. The vibration device according to claim 4, wherein
the integrated circuit is supplied with power via the second terminal, and
the second through electrode is electrically coupled to the electrically-conductive material.

6. The vibration device according to claim 4, wherein
a signal from the integrated circuit is output via the second terminal, and
the second through electrode fails to electrically be coupled to the electrically-conductive material.

7. The vibration device according to claim 1, wherein
a length of the second through electrode is longer than a width of the second through electrode.

* * * * *